US012096565B2

(12) United States Patent
Tanaka et al.

(10) Patent No.: US 12,096,565 B2
(45) Date of Patent: Sep. 17, 2024

(54) TAPE FEEDER AND MOUNT DEVICE

(71) Applicant: FUJI CORPORATION, Chiryu (JP)

(72) Inventors: Keita Tanaka, Takahama (JP); Norio Hosoi, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 443 days.

(21) Appl. No.: 17/629,323

(22) PCT Filed: Jul. 22, 2019

(86) PCT No.: PCT/JP2019/028642
§ 371 (c)(1),
(2) Date: Jan. 21, 2022

(87) PCT Pub. No.: WO2021/014529
PCT Pub. Date: Jan. 28, 2021

(65) Prior Publication Data
US 2022/0322590 A1    Oct. 6, 2022

(51) Int. Cl.
*H05K 13/04* (2006.01)
(52) U.S. Cl.
CPC .... *H05K 13/0419* (2018.08); *Y10T 29/53174* (2015.01)
(58) Field of Classification Search
CPC .......... H05K 13/0419; H05K 13/0417; H05K 13/02; Y10T 29/53174
USPC ................... 29/739, 740, 759, 762
See application file for complete search history.

(56) References Cited

U.S. PATENT DOCUMENTS 10,405,469 B2 *  9/2019  Eguchi ................ H05K 13/08
2018/0220560 A1 *  8/2018  Otsuka ............. H05K 13/0452

FOREIGN PATENT DOCUMENTS

JP       2005-183678 A    7/2005
JP       2009-54697 A     3/2009

OTHER PUBLICATIONS

International Search Report mailed on Oct. 8, 2019 in PCT/JP2019/028642 filed on Jul. 22, 2019, 1 page.

* cited by examiner

*Primary Examiner* — Thiem D Phan
(74) *Attorney, Agent, or Firm* — Oblon, McClelland, Maier & Neustadt, L.L.P.

(57) ABSTRACT

A tape feeder that feeds a carrier tape constituted of a bottom tape accommodating multiple components and a cover tape adhered to the bottom tape to supply the components includes a peeling section configured to peel the cover tape from the bottom tape at a position in front of a supply position of the component, a tension applying section configured to pull the cover tape into a predetermined location by driving a motor to collect the cover tape peeled from the bottom tape, and a holding section configured to hold the cover tape between the peeling section and the tension applying section when a power supply of the tape feeder is turned off and to release the holding of the cover tape when the power supply of the tape feeder is turned on.

4 Claims, 5 Drawing Sheets

TAPE FEEDER AND MOUNT DEVICE

TECHNICAL FIELD

The present specification discloses a tape feeder and a mount device.

BACKGROUND ART

Conventionally, as a tape feeder of this type, a tape feeder has been proposed that feeds a tape (component storage tape) consisting of a bottom tape accommodating a component and a cover tape (top tape) adhered to the upper surface of the bottom tape and supplies a component that can be picked up by a mount device by peeling the cover tape from the bottom tape (refer to Patent Literature 1, for example). The tape feeder includes a take-up roller and a pressing roller for holding the cover tape, a tape take-up mechanism having a motor that rotates the take-up roller, and a collection box disposed behind the tape take-up mechanism. The take-up roller is rotated by driving the motor of the tape take-up mechanism to pull the cover tape rearward and collects the cover tape in the collection box. In addition, the tape feeder applies a predetermined tension to the cover tape by driving the motor of the tape take-up mechanism.

PATENT LITERATURE

Patent Literature 1: JP-A-2009-54967

BRIEF SUMMARY

Technical Problem

However, in the tape feeder described above, when a power supply of the tape feeder is turned off, for example, such as the tape feeder is removed from the mount device, the tension by the motor of the tape take-up mechanism will not be applied to the cover tape. Therefore, the cover tape may be slackened during the time until the tape feeder is removed, and the slackness may cause the cover tape to float in the vicinity of a supply position of the component. In this case, the floated cover tape may interfere with a pickup operation of the component of the mount device, which is not preferable.

There is a main object of the present disclosure to appropriately prevent the cover tape from slackening when the power supply of the tape feeder is turned off.

Solution to Problem

The present disclosure has taken following means to achieve the main object described above.

A tape feeder of the present disclosure is a tape feeder that feeds a carrier tape consisted of a bottom tape accommodating multiple components and a cover tape adhered to the bottom tape to supply the components, the tape feeder including: a peeling section configured to peel the cover tape from the bottom tape at a position in front of a supply position of the component; a tension applying section configured to apply tension to the cover tape by driving a motor in order to collect the cover tape peeled from the bottom tape; and a holding section configured to hold the cover tape between the peeling section and the tension applying section when a power supply of the tape feeder is turned off and to release the holding of the cover tape when the power supply of the tape feeder is turned on.

The tape feeder according to the present disclosure includes a peeling section that peels off the cover tape from the bottom tape and a holding section that holds the cover tape between the peeling section and the tension applying section that applies tension to the cover tape by driving the motor when the power supply of the tape feeder is turned off, and releases the holding of the cover tape when the power supply is turned on. Therefore, when the power supply is turned off, even when the power supply to the motor is stopped and the tension (holding force) of the cover tape by the tension applying section is released, it is possible to prevent the cover tape from slackening. In addition, when the power supply is turned on, the tension of the cover tape by the tension applying section is not obstructed by the holding section. Accordingly, since it is possible to appropriately prevent the cover tape from slackening when the power supply of the tape feeder is turned off, it is possible to prevent the failure caused by the cover tape floating in the vicinity of the supply position of the component.

BRIEF DESCRIPTION OF DRAWINGS

FIG. 3 is a perspective view illustrating a state of operation of feeder 20 when a power supply is turned on.

FIG. 4 is an enlarged perspective view illustrating a state of operation of tension adjustment mechanism 31 when a power supply is turned on.

DESCRIPTION OF EMBODIMENTS

Figure 1:
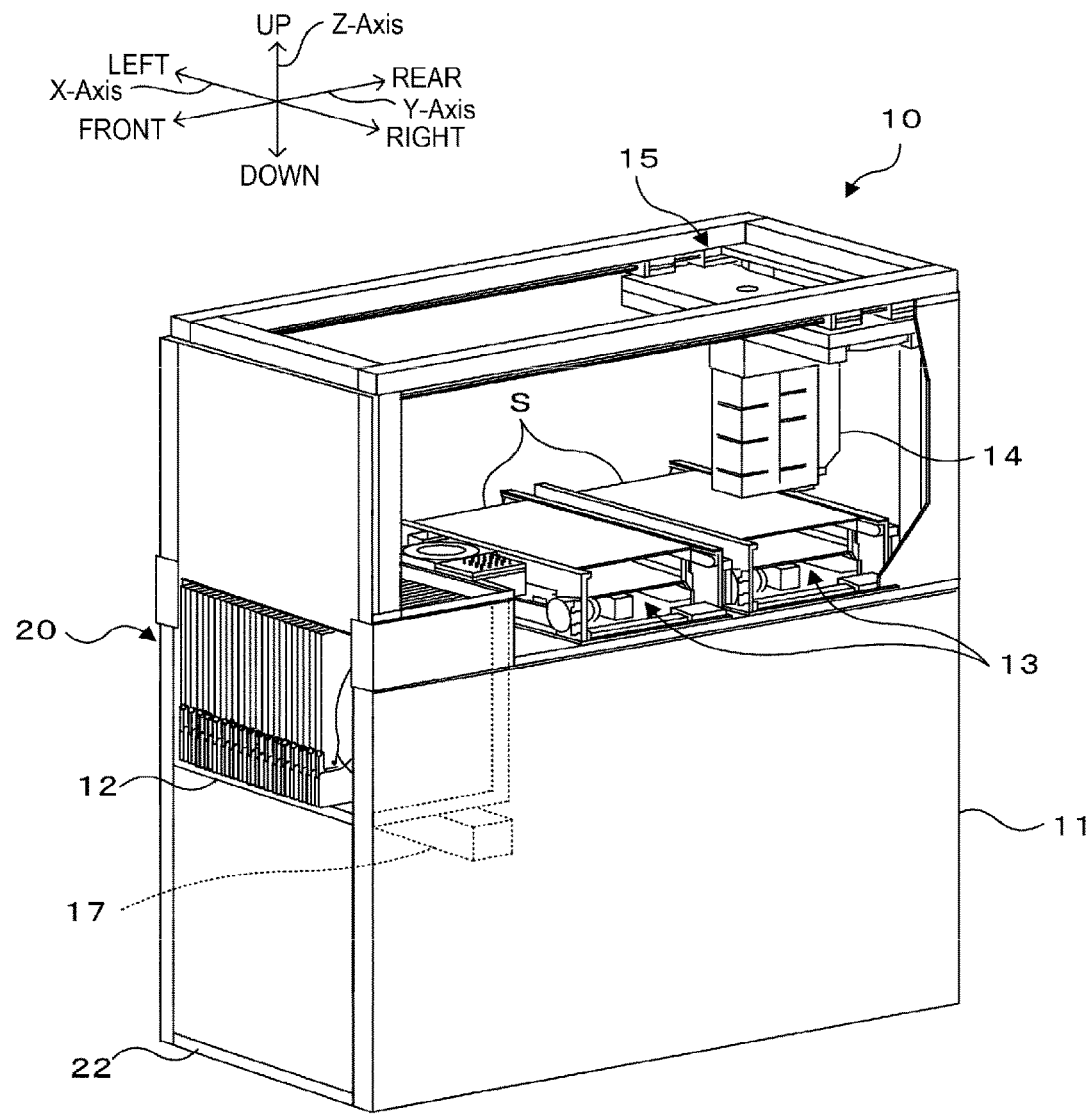
FIG. 1 is a configuration view illustrating a schematic configuration of mount device 10.
Figure 2:
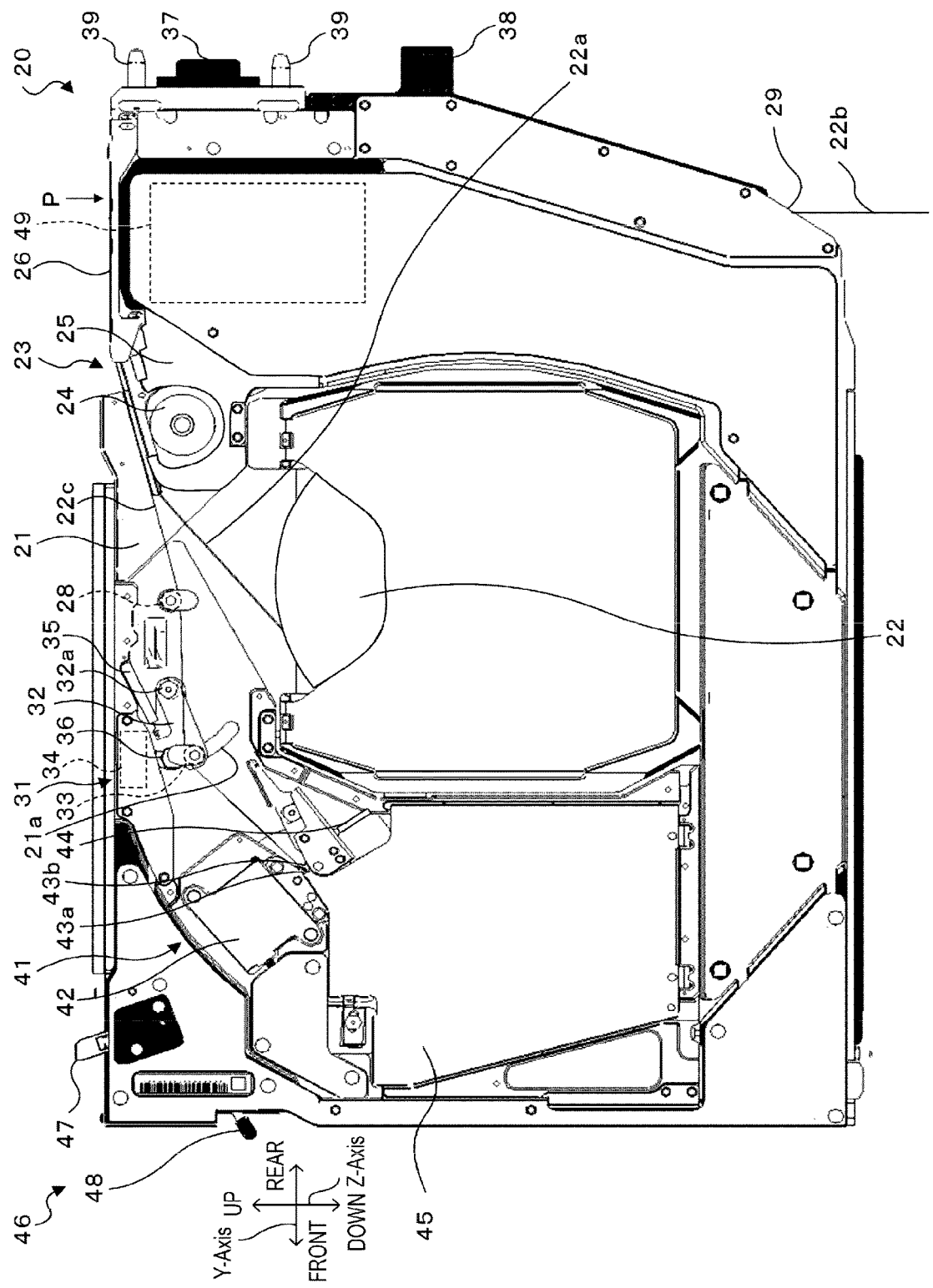
FIG. 2 is a configuration view illustrating a schematic configuration of feeder 20.

Next, embodiments of the present disclosure will be described with reference to the accompanying drawings. FIG. 1 is a configuration view illustrating a schematic configuration of mount device 10, and FIG. 2 is a configuration view illustrating a schematic configuration of feeder 20. In the present embodiment, a left-right direction (X-axis), a front-rear direction (Y-axis), and an up-down direction (Z-axis) are as illustrated in FIG. 1.

As illustrated in FIG. 1, mount device 10 includes housing 11, feeder base 12, board conveyance device 13, mounting head 14, and head moving mechanism 15. In feeder base 12, multiple feeders (tape feeders) 20 for supplying components are detachably disposed in parallel. Board conveyance device 13 is a belt conveyor device, and conveys board S from the left to the right. Mounting head 14 holds suction nozzles, picks up components supplied from feeders 20 disposed on feeder base 12 to the suction nozzles at supply position P, and mounts the components at the mounting position on board S. Head moving mechanism 15 moves mounting head 14 in XY-directions.

As illustrated in FIG. 2, in feeder 20, tape reel 22 around which carrier tape 22a is wound is set in feeder main body 21. Carrier tape 22a is consisted of bottom tape 22b in which multiple cavities (recesses) are formed at predetermined intervals in the longitudinal direction and components are accommodated in each of cavities, and cover tape 22c adhered to bottom tape 22b to cover the surface of bottom tape 22b in which components are accommodated in each of cavities. In addition, feeder 20 includes tape feeding mechanism 23, tape peeling section 26, tension adjustment mechanism 31, pull-in mechanism 41, collection section 45, clamp mechanism 46, and feeder control section 49.

Tape feeding mechanism 23 includes sprocket 24 in which engagement claws engaged to the engagement holes of carrier tape 22a are provided on the outer periphery, and driving motor 25 such as a servo motor or a stepping motor for driving sprocket 24. In a state where carrier tape 22a is engaged to sprocket 24, tape feeding mechanism 23 intermittently rotates sprocket 24 by the forward rotation of driving motor 25 to feed carrier tape 22a at a pitch toward supply position P of the component. In addition, tape feeding mechanism 23 can pull carrier tape 22a back to tape reel 22 by the reverse rotation of driving motor 25.

tape peeling section 26 is configured to peel cover tape 22c from bottom tape 22b in front of supply position P of the component to expose the components in the cavities. Cover tape 22c peeled by tape peeling section 26 is pulled out to be folded back, and is pulled in pull-in mechanism 41 through tension adjustment mechanism 31 to be collected by collection section 45. In addition, bottom tape 22b from which cover tape 22c is peeled off moves to supply position P in a state where the components are exposed, the components are picked up on mounting head 14 (suction nozzle), and bottom tape 22b is guided downward in feeder main body 21. Bottom tape 22b is discharged to the outside from tape discharge port 29 below feeder main body 21, is cut by a tape cutting mechanism (not illustrated) at a predetermined cutting position distant from tape discharge port 29, and is collected in dust box 17 (refer to FIG. 1). In addition, bottom tape 22b discharged to the outside needs to be positioned on dust box 17 again without being caught by feeder base 12 or the like when feeder 20 is once removed from mount device 10 and then attached thereto. Therefore, before feeder 20 is removed, process that stores bottom tape 22b in feeder main body 21 is performed by reversely rotating driving motor 25 of tape feeding mechanism 23 to pull carrier tape 22a back.

Tension adjustment mechanism 31 is a mechanism that adjusts a tension acting on cover tape 22c between tape peeling section 26 and pull-in mechanism 41. Tension adjustment mechanism 31 includes tension lever 32, guide roller 33, sensor board 34, spring 35, and fixing member 36. Guide roller 33 in which fulcrum 32a at one end of tension lever 32 is pivotably supported by feeder main body 21 and guides cover tape 22c to the other end of tension lever 32, and guide plate 33a (refer to FIG. 4) that prevents cover tape 22c from coming off guide roller 33 are attached to tension lever 32. When tension lever 32 is pivoted up and down around fulcrum 32a, guide roller 33 moves up and down in an arc shape. In feeder main body 21, long hole 21a in an arc shaped is formed that guides the movement of the other end (guide roller 33) of tension lever 32. In addition, fixing member 36 is fixed to feeder main body 21 in the vicinity of the edge of the upper end of long hole 21a.

In addition, tension lever 32 is provided with detection piece 32b (refer to FIG. 4) extending from the periphery edge portion in an upward direction orthogonal to a direction from one end to the other end, and locking piece 32c (refer to FIG. 4) erecting perpendicular from a part of detection piece 32b. Detection piece 32b is located within the detection range of sensor 34a included in sensor board 34 when tension lever 32 pivots upward around fulcrum 32a, and is positioned outside the detection range of sensor 34a when tension lever 32 pivots downward around fulcrum 32a (refer to FIG. 4). Sensor board 34 detects the presence or absence of detection piece 32b by sensor 34a, that is, the presence or absence of tension lever 32, and outputs a detection signal to feeder control section 49. One end of spring 35 is attached to feeder main body 21 and the other end thereof is attached to locking piece 32c of tension lever 32, and spring 35 biases tension lever 32 such that tension lever 32 rotates upward. That is, spring 35 biases tension lever 32 in a direction in which guide roller 33 is pressed against cover tape 22c.

Pull-in mechanism 41 includes driving motor 42 such as a servo motor and a stepping motor, driving gear 43a rotated by driving the driving motor 42, driven gear 43b rotated in accordance with the rotation of driving gear 43a, and spring 44 that biases driven gear 43b toward driving gear 43a side. Pull-in mechanism 41 pulls in cover tape 22c by rotating driving gear 43a with driving motor 42 and driven gear 43b and feeds cover tape 22c to the rearward, in a state where cover tape 22c is held between a pair of driving gear 43a. Collection section 45 is disposed behind pull-in mechanism 41, and cover tape 22c pulled in and fed by pull-in mechanism 41 is collected by collection section 45. Pull-in mechanism 41 can hold the rotational positions of the pair of driving gear 43a and driven gear 43b by the holding torque of driving motor 42 even when driving motor 42 is stopped when the power supply is turned on.

Guide roller 28 for guiding cover tape 22c is fixed to feeder main body 21 between tape peeling section 26 and tension adjustment mechanism 31. Guide roller 28 is formed in the same shape as guide roller 33. Cover tape 22c is fed from tape peeling section 26 to pull-in mechanism 41 in a state where cover tape 22c is in contacted with guide roller 28 from below and is stretched to be in contact with guide roller 33 from above.

Clamp mechanism 46 includes clamp pin 47 provided to be able to advance and retract in an obliquely upward direction from an upper end surface of feeder main body 21, and clamp lever 48 protruding from an end surface of feeder main body 21 and operable in an up-down direction for advancing and retracting clamp pin 47. In clamp mechanism 46, when clamp lever 48 is operated to be tilted downward, clamp pin 47 is advanced from feeder main body 21 (refer to FIG. 2), whereas when clamp lever 48 is operated to be tilted upward, clamp pin 47 is stored in feeder main body 21.

Feeder 20 is provided with connectors 37 and 38 protruding from an end surface of feeder main body 21 serving as a rear side of mount device 10 and a positioning pin 39 of two connectors 37 and 38. Although not illustrated, mount device 10 is provided with pin holes to which clamp pin 47 and each positioning pin 39 of feeder 20 can be respectively engaged, and connectors to which connectors 37 and 38 can be respectively connected. Accordingly, when feeder 20 is attached to feeder base 12 in a state where clamp pin 47 is stored in feeder main body 21, positioning pin 39 is engaged to the pin hole and connectors 37 and 38 are respectively connected to each of connectors of mount device 10. In this state, when clamp lever 48 is operated to be tilted downward, clamp pin 47 is engaged to the pin hole, and feeder 20 is locked so as not to be pulled out of feeder base 12. In addition, when clamp lever 48 is operated to be tilted upward, the lock of feeder 20 is released by pulling out clamp lever 48 from the pin hole, so that feeder 20 can be detached from feeder base 12. The attachment and detachment of feeder 20 may be performed by an operator or may be performed by an exchanging robot capable of automatically exchanging feeder 20. In addition, clamp mechanism 46 can detect the advancing and retracting state of clamp pin 47, and outputs the detection signal to feeder control section 49.

Feeder control section 49 is configured as a microprocessor including CPU, ROM, RAM, and the like, and controls entire feeder 20. Feeder control section 49 outputs a drive signal to driving motor 25 of tape feeding mechanism 23, a drive signal to driving motor 42 of pull-in mechanism 41, or the like. In addition, feeder control section 49 is input a detection signal from sensor board 34 of tension adjustment mechanism 31 to sensor 34a, a detection signal from clamp mechanism 46, or the like. In feeder 20, feeder control section 49 communicates with a control section of mount device 10 or receives power from mount device 10 through the connection between connectors 37 and 38 and a connector of mount device 10.

Figure 3:
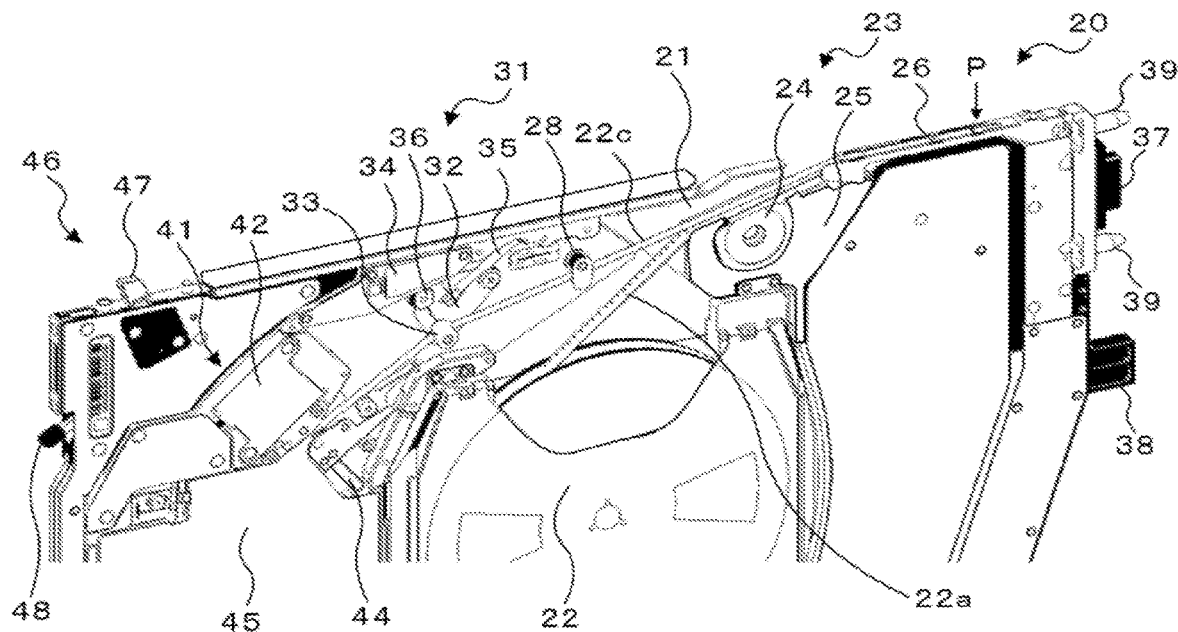
Figure 4:
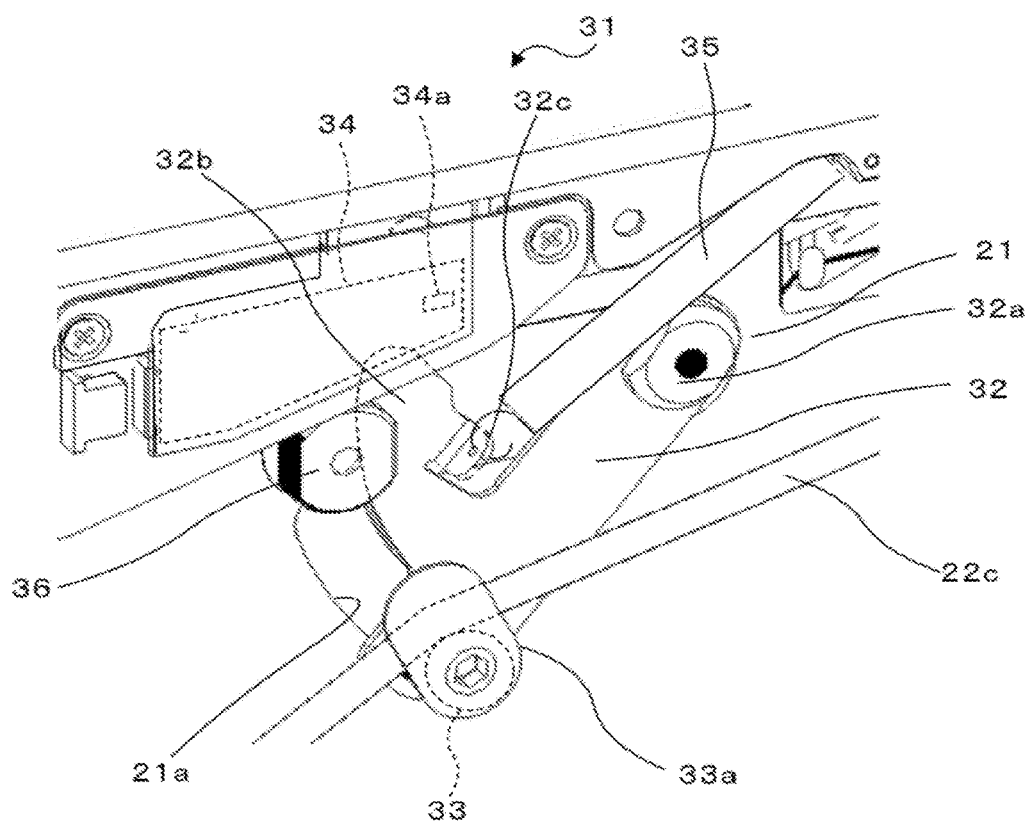

An operation of feeder 20, particularly, an operation of adjusting or holding the tension of cover tape 22c peeled from bottom tape 22b, will be described below. FIG. 3 is a perspective view illustrating a state of operation of feeder 20 when a power supply is turned on, and FIG. 4 is an enlarged perspective view illustrating a state of operation of tension adjustment mechanism 31 when a power supply is turned on. When the power supply of feeder 20 that receives power from mount device 10 is turned on, feeder control section 49 controls pull-in mechanism 41 based on the detection signal of sensor 34a input from sensor board 34 of tension adjustment mechanism 31 to adjust the tension of cover tape 22c. When feeder control section 49 detects that tension lever 32 is disposed above based on the detection signal of sensor 34a, feeder control section 49 performs pull-in control that outputs a driving instruction to driving motor 42 such that pull-in mechanism 41 pulls in cover tape 22c. As a result, cover tape 22c having an increased tension presses down guide roller 33 of tension adjustment mechanism 31 downward against the biasing force of spring 35. Tension lever 32 stops at a position where the tension of cover tape 22c and the biasing force of spring 35 are balanced with each other.

In addition, feeder control section 49 outputs a stop instruction to driving motor 42, based on the detection signal of sensor 34a, when it is detected no detection piece 32b, that is, that tension lever 32 is disposed below. As described above, since the rotational positions of driving gear 43a and driven gear 43b are held by the holding torque of driving motor 42, it is possible to prevent cover tape 22c from slackening even while driving motor 42 is stopped. Then, when feeder 20 performs a component supply operation accompanying the feeding of carrier tape 22a by tape feeding mechanism 23, cover tape 22c becomes longer by the amount corresponding to the peeling of cover tape 22c by tape peeling section 26, so that the tension is reduced. Accordingly, tension lever 32 pivots upward by the biasing force of spring 35, pushes up cover tape 22c by guide roller 33, and stops at a position where the tension of cover tape 22c and the biasing force of spring 35 are balanced with each other. Then, when tension lever 32 is detected by sensor 34a, the above-described pull-in control is performed. When the power supply is turned on, feeder 20 applies appropriate tension to cover tape 22c by performing these processes to prevent cover tape 22c from slackening.

Figure 5:
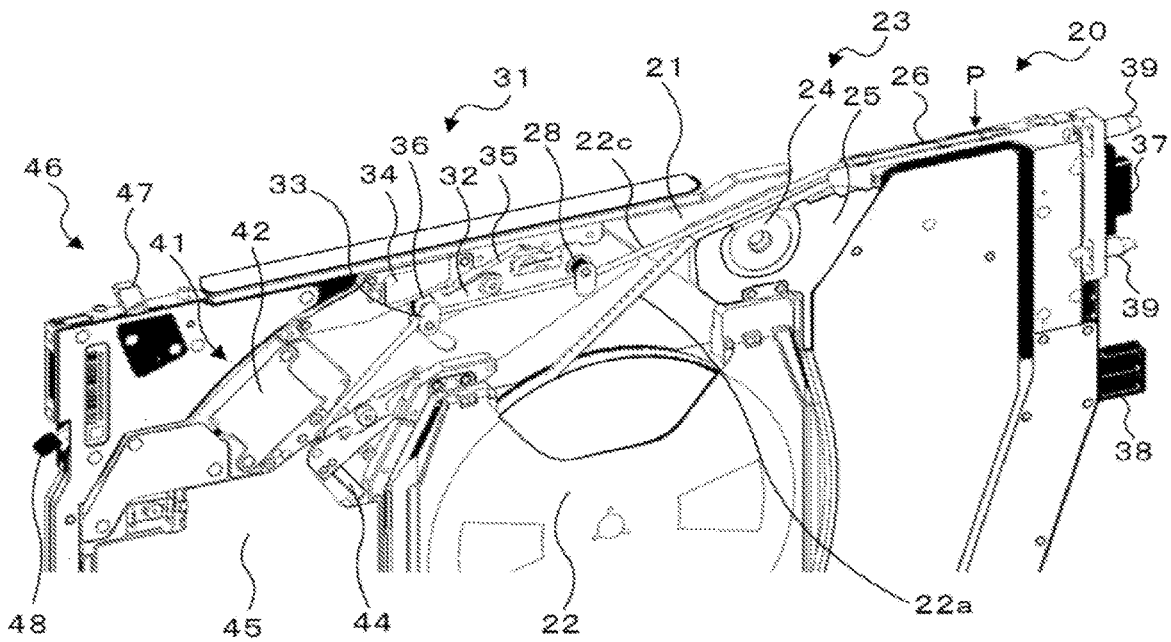
FIG. 5 is a perspective view illustrating an operation state of feeder 20 when a power supply is turned off.
Figure 6:
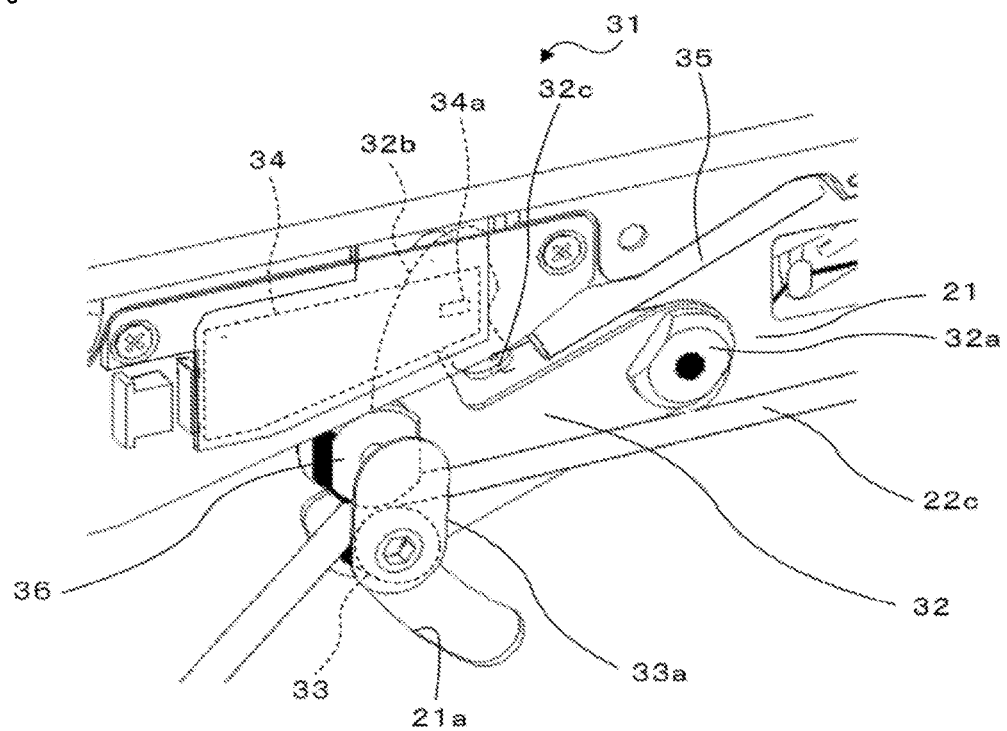
FIG. 6 is an enlarged perspective view illustrating an operation state of tension adjustment mechanism 31 when a power supply is turned off.

Next, a time when the power supply of feeder 20 is turned off will be described. FIG. 5 is a perspective view illustrating a state of operation of feeder 20 when a power supply is turned off, and FIG. 6 is an enlarged perspective view illustrating a state of operation of tension adjustment mechanism 31 when a power supply is turned off. When the power supply is turned off, the holding torque of driving motor 42 of pull-in mechanism 41 is not output, and cover tape 22c cannot be held between a pair of driving gear 43a and driven gear 43b. Accordingly, tension lever 32 pivots upward by the biasing force of spring 35. In the present embodiment, fixing member 36 is disposed above guide roller 33, and tension lever 32 pivoted upward stops at a position where guide roller 33 contacts fixing member 36 via cover tape 22c. As a result, guide roller 33 and fixing member 36 hold cover tape 22c in a state in which cover tape 22c is held therebetween. Therefore, when the power supply is turned off, it is possible to prevent cover tape 22c from slackening between tape peeling section 26 and the holding position of guide roller 33 and fixing member 36.

Figure 7:
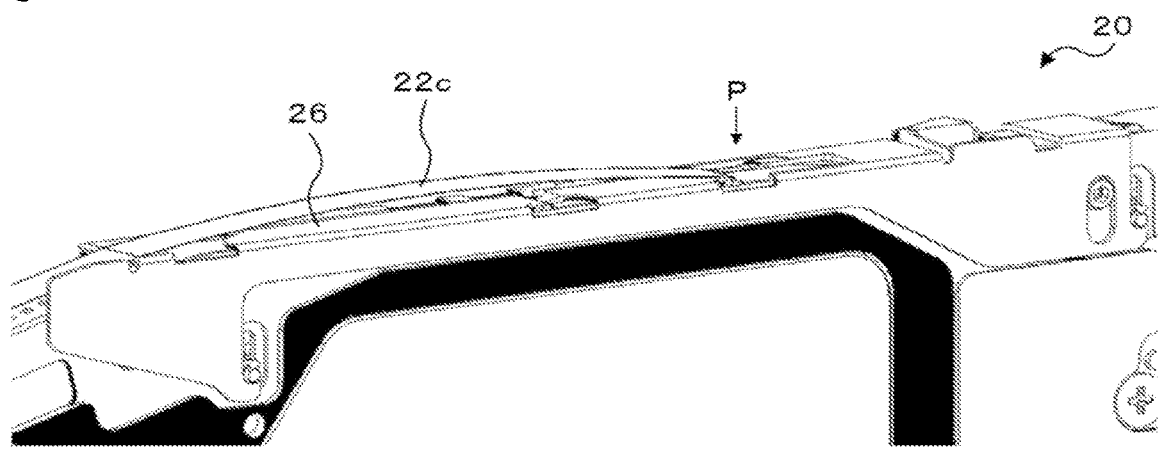
FIG. 7 is an explanatory view illustrating an example of a state in which cover tape 22c floats.

Here, FIG. 7 is an explanatory view illustrating an example of a state in which cover tape 22c floats. As illustrated in the FIG. 7, when cover tape 22c is slackened, cover tape 22c may float in the vicinity of supply position P of the component. In this case, when mounting head 14 picks up the components by the suction nozzle with adjacent feeder 20 or the like, failures such as interferences of floated cover tape 22c and the suction nozzle occur. In particular, in a case where mounting head 14 is configured as a rotary head in which multiple suction nozzles are arranged on the same circumference, since the suction nozzles move in a circumferential direction during a suction operation, the above-mentioned failures are likely to occur, and mount device 10 is highly likely to fail. In the present embodiment, since cover tape 22c is held between guide roller 33 and fixing member 36 when the power supply of feeder 20 is turned off, cover tape 22c is prevented from floating, and the above-described failure can be prevented. Cover tape 22c is slackened between pull-in mechanism 41 and the holding position of guide roller 33 and fixing member 36, but cover tape 22c is only slackened in feeder main body 21 and it does not affect the outside. As described above, when the power supply is turned on, the pull-in control is performed when sensor 34a detects detection piece 32b, and since tension lever 32 pivots downward, cover tape 22c is not held between guide roller 33 and fixing member 36. That is, since the holding cover tape 22c by guide roller 33 and fixing member 36 is released when the power supply is turned on, the adjustment or collection of the tension of cover tape 22c is not obstructed when the power supply is turned on.

When feeder 20 is removed from mount device 10, for example, the power supply is turned off on a condition that the clamp by clamp mechanism 46 is released. Even when the power supply of feeder 20 is turned off, mounting head 14 may perform a component suction operation on feeder 20 in the vicinity thereof, and the above-described failures can be prevented during the time until feeder 20 that the power supply is turned off is removed. In addition, feeder 20 of multiple component types can be set on feeder base 12, and not only feeder 20 necessary for the current production but also feeder 20 necessary for the next production may be set. In this case, even when the power supply of feeder 20 necessary for the next production is turned off in order to suppress the power consumption, the above-described failures can be prevented.

Here, correspondence relationships between constituent elements of the present embodiment and constituent elements of the present disclosure will be clarified. Feeder 20 of the present embodiment corresponds to the tape feeder of the present disclosure, tape peeling section 26 corresponds to the peeling section, pull-in mechanism 41 corresponds to the tension applying section, and fixing member 36 that holds cover tape 22c between fixing member 36 and guide roller 33 included in tension adjustment mechanism 31 corresponds to the holding section. Guide roller 33 corresponds to the pressing member, spring 35 corresponds to the spring, tension adjustment mechanism 31 corresponds to the adjustment section, and fixing member 36 corresponds to the fixing member. In addition, the pair of driving gear 43a and driven gear 43b correspond to the pair of rotating members, and collection section 45 corresponds to the predetermined collecting location. Mount device 10 corresponds to the mount device.

In feeder 20 described above, when the power supply is turned off, cover tape 22c is held between guide roller 33 and fixing member 36 of tension adjustment mechanism 31 in a position between tape peeling section 26 and pull-in mechanism 41, and when the power supply is turned on, the holding of cover tape 22c is released. Therefore, it is possible to prevent cover tape 22c from slackening when the power supply of feeder 20 is turned off with a simple configuration, and it is possible to prevent the failure caused by cover tape 22c floating in the vicinity of supply position P of the component.

In addition, guide roller 33 can be used for both holding cover tape 22c when the power supply is turned off and adjusting the tension of cover tape 22c when the power supply is turned on, so that the number of components can be suppressed. In addition, feeder 20 may rotate carrier tape 22a in a reverse direction in order to store bottom tape 22b in feeder main body 21, so that a reverse rotation prevention mechanism such as a one-way clutch cannot be provided on driving gear 43a and driven gear 43b. Therefore, it is highly meaningful to prevent cover tape 22c from slackening between guide roller 33 and fixing member 36.

The present disclosure is not limited to the embodiment that has been described heretofore at all, and needless to say, the present disclosure may be carried out in various modes without departing from the technical scope thereof.

For example, in the above embodiment, guide roller 33 is used for both holding cover tape 22c when the power supply is turned off and adjusting the tension of cover tape 22c when the power supply is turned on, but the present disclosure is not limited to this, and a dedicated holding section of cover tape 22c when the power supply is turned off may be provided between tape peeling section 26 and tension adjustment mechanism 31. For example, the dedicated holding section includes a pressing member, a spring that biases the pressing member in a direction of pressing the pressing member against cover tape 22c, an electromagnetic section that moves the pressing member against biasing force of the spring by an electromagnetic force, and a fixing member that holds cover tape 22c between the fixing member and the pressing member. When the power supply is turned on, the holding section separates the pressing member from the fixing member by the electromagnetic force of the electromagnetic portion to release holding of cover tape 22c, whereas when the power supply is turned off, the electromagnetic force of the electromagnetic portion is released and the pressing member is pressed against cover tape 22c by the biasing force of the spring to hold cover tape 22c between the pressing member and the fixing member.

In the above embodiment, carrier tape 22a is rotated in the reverse direction in order to store bottom tape 22b in feeder main body 21, but the present disclosure is not limited to this, and carrier tape 22a may be rotated in the reverse direction for other purposes such as fine adjustment of supply position P.

In the above embodiment, pull-in mechanism 41 pulls in cover tape 22c to collection section 45 side, but the present disclosure is not limited to this, and pull-in mechanism 41 may pull cover tape 22c into a predetermined location for collecting cover tape 22c. For example, in the same case as bottom tape 22b discharged to the outside and collected, cover tape 22c may be pulled in toward the discharge port thereof.

In the above embodiment, although the tension is applied to cover tape 22c by pulling cover tape 22c in collection section 45 side by pull-in mechanism 41, the tension is not limited to this, the tension may be applied to cover tape 22c by driving the motor in order to collect cover tape 22c, such as applying the tension by collecting cover tape 22c while winding cover tape 22c.

Here, the tape feeder of the present disclosure may be configured as follows. The tape feeder according to the present disclosure includes an adjustment section configured to adjust the tension of the cover tape by pressing a pressing member, the adjustment section having the pressing member and a spring that biases the pressing member in a direction of pressing the pressing member against the cover tape between the tension applying section and the peeling section, in which the holding section may be a fixing member fixed to a main body of the tape feeder such that the cover tape is held between the fixing member and the pressing member pressed against the cover tape. In this way, the pressing member of the adjustment section can be used for both holding the cover tape when the power supply is turned off and adjusting the tension of the cover tape when the power supply is turned on, so that the number of components can be suppressed. In addition, since the cover tape is held between the pressing member of the adjustment section and the fixing member fixed to the main body, the cover tape can be prevented from slackening when the power supply is turned off with a simple configuration.

In the tape feeder according to the present disclosure, the tension applying section may be configured to pull the cover tape into the predetermined location by the pair of rotating members rotated by driving the motor in a state that the cover tape is held, and the carrier tape is fed in a direction opposite to a direction in which the carrier tape is fed to the supply position of the component in some cases. When the carrier tape is fed in the reverse direction, the cover tape and the bottom tape are also fed in the reverse direction. Therefore, since a reverse rotation preventing mechanism such as a one-way clutch cannot be provided on the rotating member of the tension applying section, it is highly meaningful to apply the contents of the present disclosure. As an example of the case where the carrier tape is fed in the reverse direction, it is included that when the bottom tape exceeds the supply position of the component, the bottom tape is discharged to the outside from below the main body of the tape feeder, in a case where the bottom tape is cut at a predetermined cutting position, the bottom tape exposed to the outside is returned into the main body by feeding the carrier tape in the reverse direction before the power supply of the tape feeder is turned off.

The mount device of the present disclosure is configured to perform mounting process in which any of the tape feeders described above is detachably attached, and the component supplied from the tape feeder to the supply position is picked up by a pickup member and mounted on a board.

In the mount device of the present disclosure, similarly to the tape feeder described above, it is possible to appropriately prevent the cover tape from slackening when the power supply of the tape feeder is turned off. Therefore, since the cover tape floats in the vicinity of the supply position of the component, it is possible to prevent the occurrence of failures such as interference with the pickup member.

INDUSTRIAL APPLICABILITY

The present disclosure can be applied to a tape feeder, a manufacturing industry of a mount device to which the tape feeder is attached, or the like.

REFERENCE SIGNS LIST

10 Mount device, 11 Housing, 12 Feeder base, 13 Board conveyance device, 14 Mounting head, 15 Head moving mechanism, 17 Dust box, 20 Feeder, 21 Feeder main body, 21a Long hole, 22 Tape reel, 22a Carrier tape, 22b Bottom tape, 22c Cover tape, 23 Tape feeding mechanism, 24 Sprocket, 25 Driving motor, 26 tape peeling section, 28 Guide roller, 29 Tape discharge port, 31 Tension adjustment mechanism, 32 Tension lever, 32a Fulcrum, 32b Detection piece, 32c Locking piece, 33 Guide roller, 33a Guide plate, 34 Sensor board, 34a Sensor, 35 Spring, 36 Fixing member, 37, 38 Connector, 39 Positioning pin, 41 Pull-in mechanism, 42 Driving motor, 43a Driving gear, 43b Driven gear, 44 Spring, 45 Collection section, 46 Clamp mechanism, 47 Clamp pin, 48 Clamp lever, 49 Feeder control section, S Board, P Supply position

The invention claimed is:

1. A tape feeder that feeds a carrier tape consisted of a bottom tape accommodating multiple components and a cover tape adhered to the bottom tape to supply the components, the tape feeder comprising:
   a peeling section configured to peel the cover tape from the bottom tape at a position in front of a component supply position;
   a tension applying section configured to apply tension to the cover tape by driving a motor in order to collect the cover tape peeled from the bottom tape; and
   a holding section configured to hold the cover tape between the peeling section and the tension applying section when a power supply of the tape feeder is turned off and to release the holding of the cover tape when the power supply of the tape feeder is turned on.

2. The tape feeder according to claim 1, further comprising:
   an adjustment section configured to adjust the tension of the cover tape by pressing a pressing member, the adjustment section having the pressing member and a spring that biases the pressing member in a direction of pressing the pressing member against the cover tape between the peeling section and the tension applying section,
   wherein the holding section is a fixing member fixed to a main body of the tape feeder such that the cover tape is held between the fixing member and the pressing member pressed against the cover tape.

3. The tape feeder according to claim 1,
   wherein the tension applying section is configured to pull the cover tape into a predetermined collecting location by a pair of rotating members rotated by driving the motor while pinching the cover tape, in a state of pinching the cover tape, and
   the carrier tape is fed in a direction opposite to a direction in which the carrier tape is fed to the supply position of the component in some cases.

4. A mount device wherein
   the tape feeder according to claim 1 is detachably attached to the mount device, and
   the mount device performs a mounting process in which the component supplied from the tape feeder to the supply position is picked up by a pickup member and mounted on a board.

* * * * *